United States Patent [19]

Yang et al.

[11] Patent Number: 4,869,780

[45] Date of Patent: Sep. 26, 1989

[54] ION MILLING METHOD

[75] Inventors: Jane J. J. Yang, Los Angeles; William W. Simmons, Rancho Palos Verdes; Michael Jansen; Jaroslava Z. Wilcox, both of Los Angeles; Moshe Sergant, Culver City, all of Calif.

[73] Assignee: TRW Inc., Redondo Beach, Calif.

[21] Appl. No.: 178,711

[22] Filed: Apr. 7, 1988

Related U.S. Application Data

[63] Continuation of Ser. No. 36,608, Apr. 10, 1987, abandoned.

[51] Int. Cl.[4] .................. H01L 21/306; B44C 1/22; C03C 15/00; C03C 25/06
[52] U.S. Cl. ........................... 156/643; 156/648; 156/655; 156/662; 156/345; 204/192.34; 204/192.35; 357/17; 357/16; 357/55; 437/129; 372/46; 372/50
[58] Field of Search ............ 357/16, 17, 19, 55, 357/30; 372/43–50; 437/23, 55, 127, 129; 156/643, 644, 646, 647, 648, 655, 662, 345; 204/192.34, 192.35, 298

[56] References Cited

U.S. PATENT DOCUMENTS

| | | | |
|---|---|---|---|
| 3,996,492 | 12/1976 | McGroddy | 357/17 X |
| 4,016,062 | 4/1977 | Mehta et al. | 204/192.34 |
| 4,080,245 | 3/1978 | Yamanaka et al. | 156/647 |
| 4,293,826 | 10/1981 | Scifres et al. | 357/19 X |
| 4,354,898 | 10/1982 | Coldren et al. | 156/647 |
| 4,460,434 | 7/1984 | Johnson et al. | 156/657 X |
| 4,692,207 | 9/1987 | Bouadma et al. | 357/19 X |
| 4,698,129 | 10/1987 | Puretz et al. | 156/643 |
| 4,784,722 | 11/1988 | Lian et al. | 156/655 X |

FOREIGN PATENT DOCUMENTS

| | | | |
|---|---|---|---|
| 3138704 | 4/1983 | Fed. Rep. of Germany | 437/129 |
| 8504529 | 10/1985 | France | 437/129 |

OTHER PUBLICATIONS

J. J. Yang et al., "Surface-Emitting GaAlAs/GaAs Laser with Etched Mirrors", Electronics Letters, Apr. 10, 1986, vol. 22, No. 8, pp. 438–439.

Primary Examiner—William A. Powell
Attorney, Agent, or Firm—James M. Steinberger

[57] ABSTRACT

An ion milling method is disclosed that provides a manufacturing technique for mass producing microscopic surface features using a wide variety of media that includes semiconductors, metals, and glasses. In the preferred embodiment, vertical and 45 degree mirrors are formed simultaneously in semiconductor laser diodes in order to produce monolithic two dimensional arrays of surface emitting lasers. Standard double heterostructure semiconductor laser diodes are first grown on a wafer using metalorganic chemical vapor deposition techniques. An ion milling gun is oriented at a particular angle from the longitudinal axis of the active layer of the laser and emits a stream of atomic particles toward the lasers producing a generally two sided cut or notch that extends downward from the top surface of the semiconductor laser and traverses the active layer. The two sides of the cut consist of a vertical face that is perpendicular to the active layer and an inclined mirror surface that connects to the bottom of the vertical face and the slopes back upward to the top of the laser. Although the preferred utilization of this invention is the production of high power semiconductor laser arrays and subsequent wafer scale integration, the ion milling technique may be employed to construct a wide variety of micro-miniature radiation interfaces, reflectors, transmitters, or absorbers. Virtually any surface that requires a specifically determined configuration of uniform topography of atomic proportions may be produced.

5 Claims, 12 Drawing Sheets

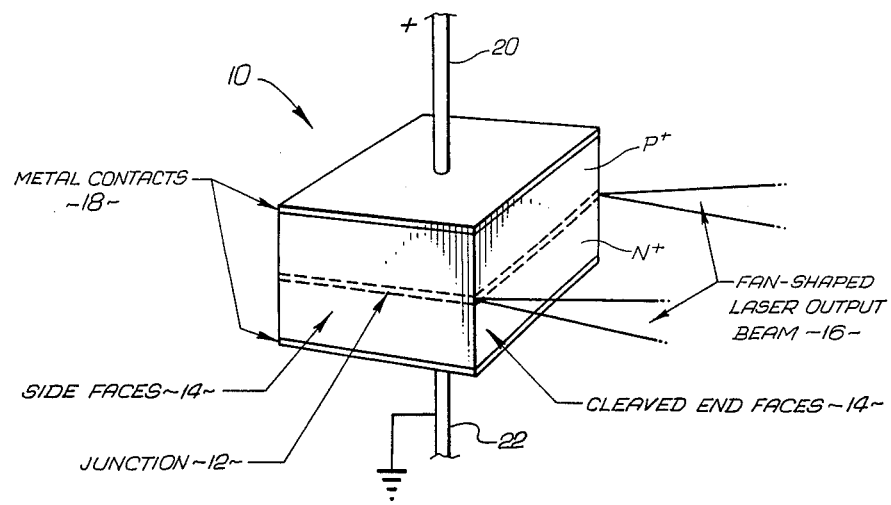
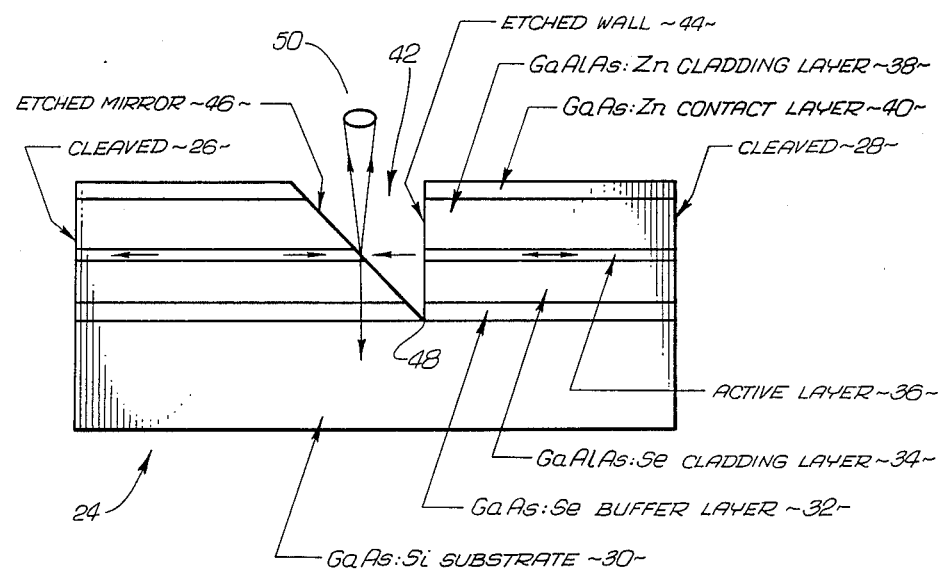

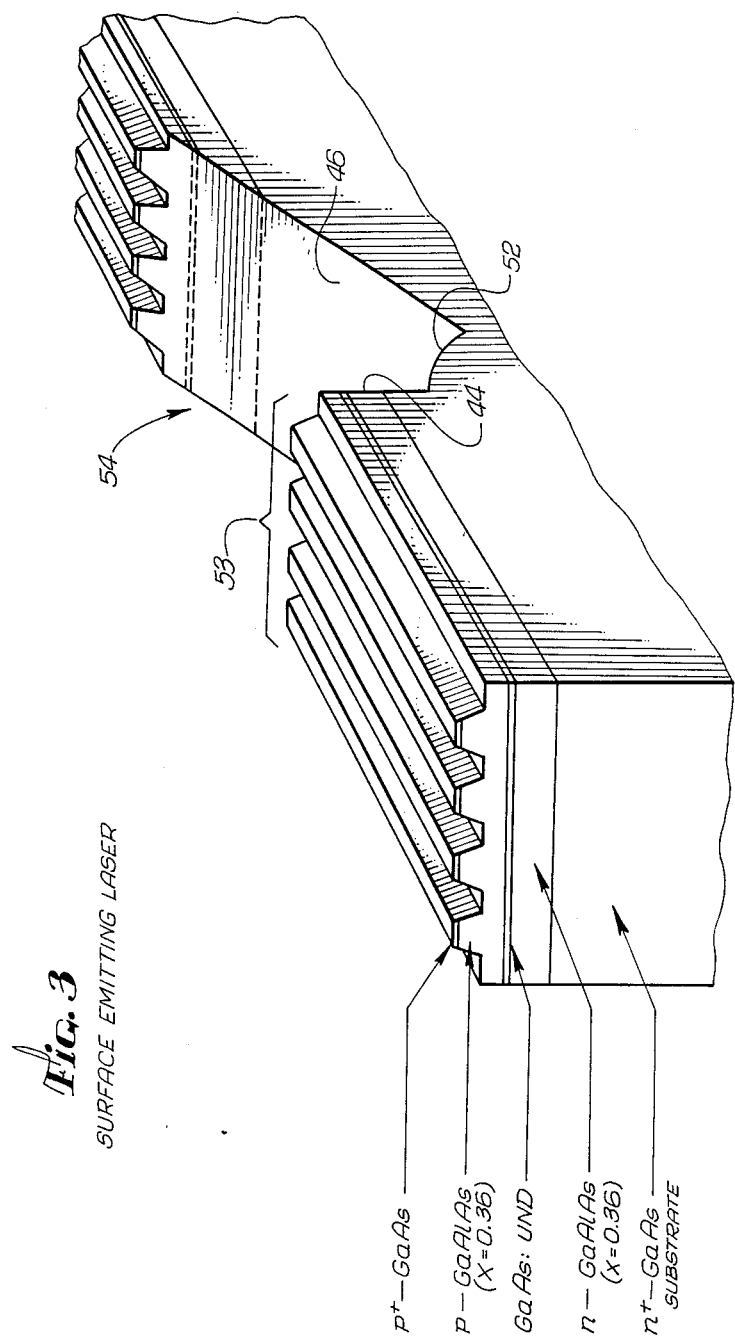

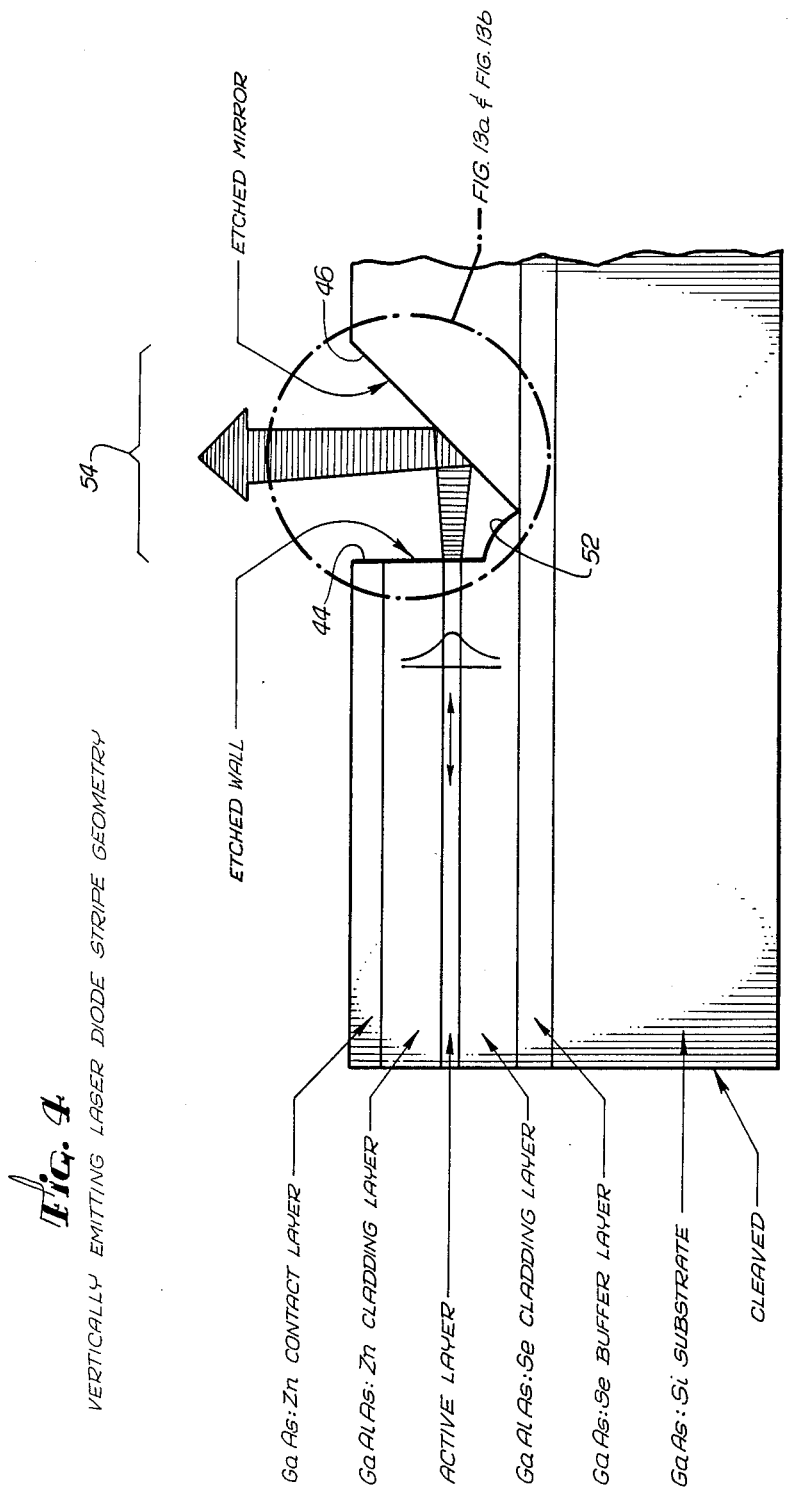

OUTPUT POWER VS CURRENT FOR 11 ELEMENT DC ARRAY

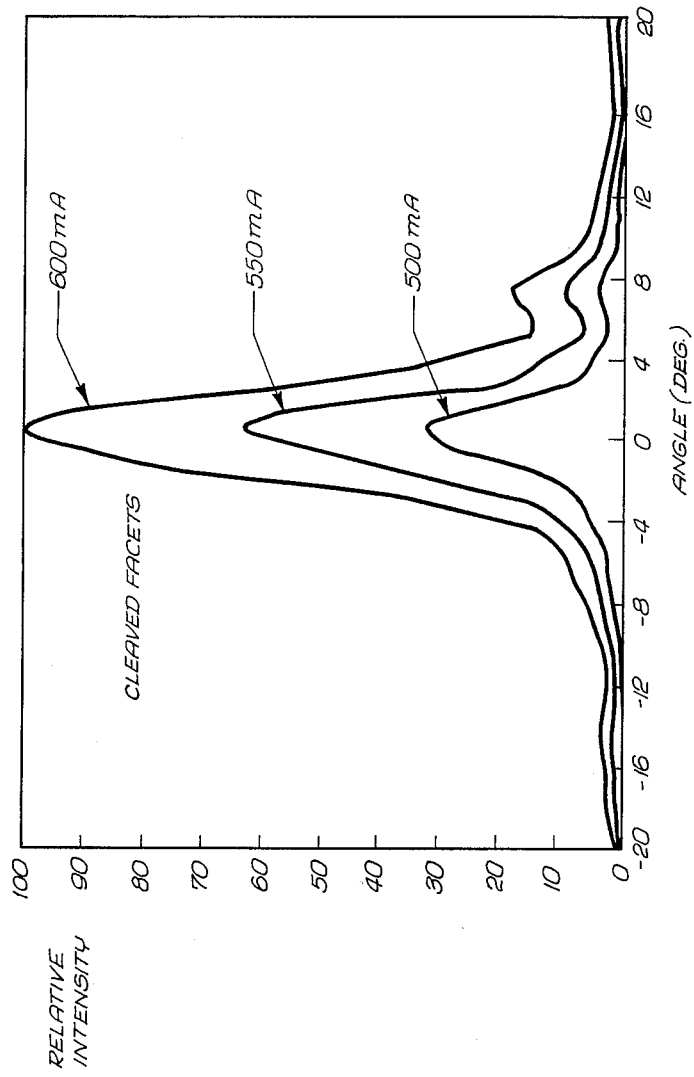

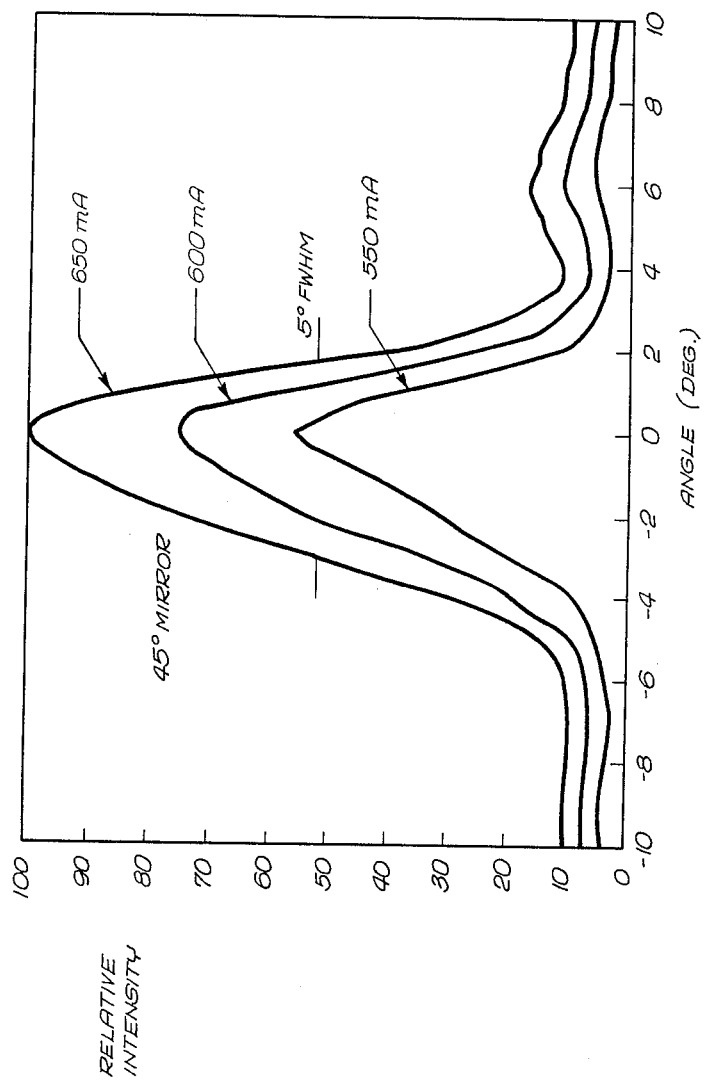

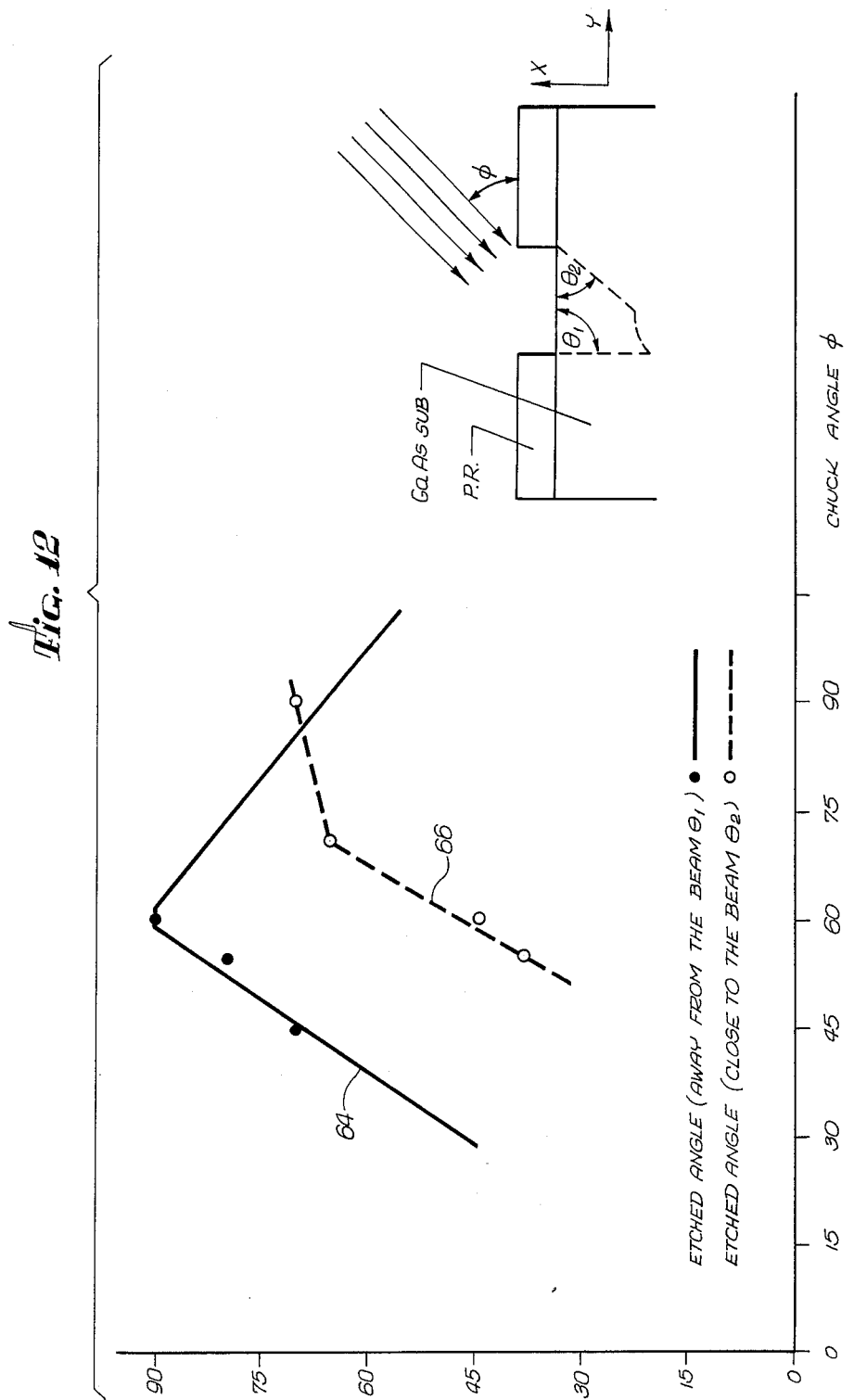

ION MILLING METHOD

This is a continuation of application Ser. No. 07/036,608, filed Apr. 10, 1987, abandoned.

BACKGROUND OF THE INVENTION

The present invention relates to methods for forming and shaping minute surfaces with great precision. In particular, this invention may be employed to fabricate a wide variety of complex devices having intricate geometric features. The ion milling method was developed in order to manufacture surface emitting semiconductor lasers, but the technique may be utilized to efficiently and accurately mass produce a virtually infinite number of different surface features of nearly any medium on a microscopic scale.

The technical background of the present invention generally pertains to recent efforts to design and manufacture extremely small lasers from semiconductor materials. Semiconductor lasers are typically multilayered structures having dimensions measured in millionths of a meter and including different kinds of semiconductor material. One of the chief advantages of using semiconductor lasers to generate output radiation is their extraordinarily high efficiency. The various layers comprising these minute lasers are composed of chemically doped semiconductor elements or compounds. Before the doping process, semiconductor material generally contains an equal number of negative and positive particles. The doping process alters the relative number of negatively charged electrons or positively charged holes by introducing additional numbers of charged particles into the originally neutral semiconductor matrial. Regions of the laser that have been doped with extra electrons are called n-type, while those populated by a majority of holes are referred to as p-type.

The basic structure of a semiconductor laser is that of a diode, an electrical device that conducts current in only in one direction. A simple cube-shaped structure that illustrates the most fundamental semiconductor laser design is shown in FIG. 1. A diode can be formed by joining a region of n-type material with a region of p-type material. In a semiconductor laser, a relatively thin zone of material that is capable of lasing is sandwiched between the n- and p-type regions. This central zone is called the active layer. When an electrical potential is imposed across the n and p regions through metal contacts attached to the exterior faces of the laser, the electrons and holes respond to the mutually attractive electrical field that this biasing voltage creates. The particles migrate across the boundaries of the central junction into the active layer and combine with their opposites. This combination process is accompanied by the emission of laser light. The strata above and below the narrowly confined active layer have a lower index of refraction than the active layer, which means that the laser light is repeatedly reflected between the n and p regions within the active layer. The only places that are available as exits for the laser output are the peripheral edges of the active layer along the outer wall of the semiconductor laser.

Since the laser output can only radiate from a narrow stripe that extends around the mid-section of the entire structure, it is exceedingly difficult to control and use the energy produced by this very simple laser. In this embodiment, the output fans out from the cube in every direction from the plane of the active layer. The energy that is generated is weak and diluted, since the stream of light cannot be gathered into a concentrated beam that can be pointed and controlled to accomplish some task. because these laser cubes are so small, one obvious way to bolster the total energy output would be to combine them together in an array. Although an assembly of many individual cubes deployed together in a planar arrangement is an attractive alternative, the simple cube structure depicted in FIG. 1 cannot fulfill this design because most of the energy emitted by each individual laser would be directed at a neighboring cube in the two dimensional array. At best, this laser architecture may be employed to form a long row of individual cubes that would emit a wide but still relatively weak stream of laser radiation.

Over the past decade, this very simple device has been vastly improved and refined. The current generation of semiconductor laser diodes includes structures having many complex layers that are formed with a multitube of exotic techniques. Recent efforts have produced complex architectures called double and buried heterojunction designs that are fabricated using an assortment of laboratory processes. Perhaps the single most important objective of recent research in this field has been the quest to produce a two dimensional array of semiconductor lasers that emit laser output in a direction that is perpendicular to the plane of the active layer. Organizing many individual lasers that emit light from their top surfaces together in a matrix would provide a means of constructing highly powerful radiation sources. Recent experimentation has yielded semiconductor lasers that incorporate tiny mirrors oriented 45 degrees from the plane of the active layer that are capable of directing some of all of the lasers emission through apertures above the mirrors. Most of these advances utilize cleaving, wet-chemical etching, dicing, second-order grating, or mass-transport procedures that are generally difficult to perform, unreliable, and unsuitable for high volume manufacture.

The electronics industry has devoted enormous efforts in the past several years to find a solution to the long-felt need for a method of fabricating surface emitting semiconductor laser diodes. Such a method would enable not only laser manufacturers but also designers of integrated circuits to control the size and shape of sub-micron features with unprecedented accuracy. Such an advance in the technology would be a fundamental construction technique for optical computer circuits, in which photons would replace electrons as the carriers of information within complex light pathways. The ideal solution to this problem would provide a practical and efficient means for growing thousands, millions, and, perhaps, billions of lasers simultaneously layer by layer on a single wafer. This method would be equally effective in fashioning sub-micron or atomic scale features in a diverse range of media. Although a chief use would certainly include the production of lasers from semiconductor materials, the technique would be invaluable in constructing any sort of micro-miniature radiation interface, reflector, transmitter, or absorber. Virtually any surface that requires a specifically determined configuration of uniform topography could be achieved using such an invention, irrespective of whether the original medium was a semiconductor, a metal, or an active or passive optical material. The Ion Milling Method claimed in this patent application addresses these objectives and provides a solution to this long-felt need.

SUMMARY OF THE INVENTION

The present invention provides a method for mass producing microscopic surface features using a wide variety of media that includes semiconductors, metals, and glasses. In the preferred embodiment, vertical and 45 degree mirrors are formed simultaneously in semiconductor laser diodes in order to produce monolithic two dimensional arrays of surface emitting lasers. Standard double heterostructure semiconductor laser diodes are first grown on a wafer using metalorganic chemical vapor deposition techniques that are well known to persons ordinarily skilled in the art. After the wafer is protected with a mask that shields areas that are not to be milled, the wafers are loaded in a chamber, and the chamber is evacuated. An inert gas such as argon is then introduced into the ion milling chamber in order to maintain a predetermined vacuum pressure. An ion milling gun is then aimed at the wafer workpiece and is oriented at a particular angle from the longitudinal axis of the active layer of the laser. The ion milling gun is then activated, sending a stream of atomic particles towards the lasers on the wafer. As the milling process proceeds, the rate of removing materials from the workpiece may be controlled and monitored by adjusting the intensity of the ion gun and by sampling the pressure in the chamber. The result of the ion milling process is a generally two sided cut or notch that extends downward from the top surface of the semiconductor laser and traverses the active layer. The two sides of the cut comprise a vertical face that is perpendicular to the active layer and an inclined mirror surface that connects to the bottom of the vertical face and then slopes back upward to the top of the laser. Depending on the medium, a small horizontal shelf region may be formed between the vertical cut and the inclined mirror, which gives the resulting milled notch a three sided configuration. The notches may then be finished by applying various stabilizing, dielectric, or metal coatings to enhance the laser performance or maximize reflectivity.

An appreciation of other aims and objects of the present invention and a more complete and comprehensive understanding of this invention may be achieved by studying the following description of a preferred embodiment and by referring to the accompanying drawings.

BRIEF DESCRIPTION OF THE DRAWINGS

FIG. 1 is a perspective view of a simple, cube shaped semiconductor laser diode that emits radiation from a narrow region at the mid-section of its side walls.

FIG. 2 is a cross-sectional view of a semiconductor laser produced in accordance with the present invention. A two-sided notch that includes a vertical cut and a 45 degree mirror is shown extending down into the laser, traversing the active layer and terminating at the lower cladding layer.

FIG. 3 is a perspective view of a semiconductor laser produced in accordance with the present invention. The cut formed by the ion milling process shown in this drawing consists of three sides, a vertical cut, a 45 degree mirror, and a curved shelf region.

FIG. 4 is a cross-sectional view of an ion milled semiconductor laser with a three sided notch.

FIGS. 7 through 12 present data collected during actual tests of semiconductor lasers fabricated using the ion milling method.

DESCRIPTION OF A PREFERRED EMBODIMENT

Figure 5:
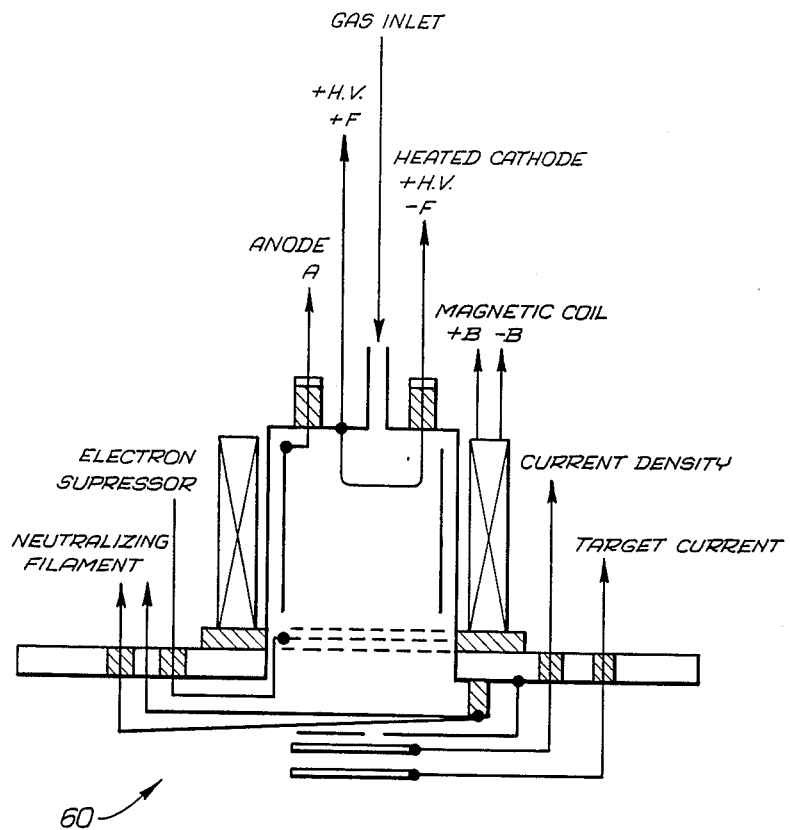
FIG. 5 is a schematic illustration of the ion gun apparatus that is employed in the ion milling method.

Appendix I of this patent application consists of a publication entitled "Surface-Emitting GaAlAs/GaAs Laser With Etched Mirrors" by J. J. Yang, M. Jansen, and M. Sergant. This article was published in Electronics Letters, Volume 22, Number 8, on pages 438-439, dated Apr. 10, 1986. This article briefly explains the results obtained through the practice of the invention claimed in this application and is hereby incorporated by reference.

The present invention provides a method for mass producing microscopic surface features using a wide variety of media that includes semiconductors, metals, and glasses. In the preferred embodiment, vertical and 45 degree mirrors are formed simultaneously in semiconductor laser diodes in order to produce monolithic two dimensional arrays of surface emitting lasers. Standard double heterostructure semiconductor laser diodes are first grown on a wafer using metalorganic chemical vapor deposition techniques that are well known to persons ordinarily skilled in the art. Stripes having widths of four microns may be defined on the wafer using conventional 1350J-SF photoresist material. The wafer is protected with a mask of material that is highly resistant to ion milling. This step shields areas that are not to be milled so that they are retained in their original condition. Most metals are relatively resistant to ion milling, as compared to semiconductor material. The wafers are then loaded in a chamber, and the chamber is evacuated to about $10^{-6}$ torr. An inert gas such as argon is then introduced into the ion milling chamber in order to maintain a vacuum pressure of about $8 \times 10^{-5}$ torr.

An ion milling gun is then aimed at the wafer workpiece. The device used by the applicants in actual tests of the method of the invention claimed below was a Microetch machine manufactured by Veeco. The gun is oriented at a particular beam angle from the longitudinal axis of the active layer of the laser. The beam angle is determined by referring to the empirical plot shown in FIG. 12, which is discussed in greater detail below. For example, FIG. 12 indicates that the proper beam angle (measured along the x-axis) for forming a 45 degree surface at the same time as a 90 degree surface (measured along the y-axis) is about 30 degrees or about 60 degrees measured along the y-axis.

Once the proper spatial adjustments are completed, the ion milling gun is then activated. In this procedure, the Microetch System, which is a conventional laboratory ion gun, is typically operated at magnet and accelerator power levels of 35 volts, 0.8 amberes and 500 volts, 500 milliamperes, respectively. Once the gun is energized, a stream of ions is sent towards the lasers on the wafer. Any particles, whether atomic, ionic, molecular, charged, or uncharged, will perform the ion milling task. The momentum of the impinging particles cuts away portions of the workpiece in the beam's path. The typical milling rate encountered in actual tests by the inventors was 3 millionths of a meter of depth milled per hour. As the milling process proceeds, the rates of removing materials from the workpiece may be controlled and monitored by adjusting the intensity of the ion gun and by sampling the pressure in the chamber. In order to prevent overheating, the chamber is typically cooled to provide a roughly constant temperature of 20 degrees Centigrade.

The result of the ion milling process is a generally two sided but or notch that extends downward from the top surface of the semiconductor laser and traverses the active layer The two sides of the notch or cut consist of a vertical face or wall that is perpendicular to the active layer and an inclined mirror surface that connects to the bottom of the vertical face and then slopes back upward to the top of the laser. Depending on the medium, a slight horizontal shelf region may be formed between the vertical cut and the inclined mirror, which gives the resulting milled notch a three sided configuration. The notch may be milled to a smooth finish by reducing the intensity of the ion beam for a short period of time after the geometry of the milled features are substantially completed. In actual tests, the inventors found that is was useful to reduce the accelerator voltage to 250 volts and the accelerator current to 200 mA for about 30 minutes at the end of the entire milling procedure. The notches may then be finished by applying various stabilizing, dielectric, or metal coatings to enhance the laser performance or maximize reflectivity. Various reactive chemicals may also be injected into the chamber at the conclusion of the milling process in order to remove slag that sometimes forms at the base of the notch.

While the method recited above calls for a fixed ion beam angle throughout the entire milling process, persons possessing ordinary skill in the art will readily understand that it would be possible to vary the orientation of the ion beam according to a time dependent function during the milling operation. This would enable the production of a nearly infinite variety of any desired planar, non-planar, curved, or irregular surface to be formed on a given workpiece. Similarly, the workpiece itself need not be limited to a planar surface.

The ion mling method is not limited to workpieces composed of semiconductor materials. Any substance that can be placed in an evacuated chamber that is susceptible to milling by atomic bombardment may be utilized. Because of the broad range of semiconductors, metals, and glasses that may be shaped using this technique, the ion milling method may be employed ot produce any radiation interface, absorber, transmitter, or reflector on a microscopic scale.

The devices produced using the method of the present invention may be more clearly understood by referring to the twelve drawing figures. FIG. 1 is a perspective view of one of the early versions of a cube shaped semiconductor laser diode 10 that is well known to persons ordinarily skilled in the art. The laser 10 emits radiation from a narrow region coincident with the lateral edges of a junction that encloses an active layer 12 at the mid-section of its side walls 14. Laser emission is stimulated by applying a forward bias voltage through metal contacts 18 and leads 20 and 22 that causes excess holes from the p layer and excess electrons from the n layer to migrate to the active layer 12 and recombine. One great disadvantage of this design is that the laser radiation diverges in a weak, fan-shaped beam 16. Another problem with this version of the laser diode is that the largest useful array that can be assembled using this configuration is a long strip or bar one or two diodes wide.

FIG. 2 is a cross-sectional view of a semiconductor laser 24 produced in accordance with the present invention. Two cleaved end surfaces 26 and 28 provide the lateral boundaries for six horizontal strata: a GaAs:Si substrate 30, a GaAs:Se buffer layer 32, a lower GaAlAs:Se cladding layer 34, ana ctive layer 36 composed of a laser gain medium, an upper cladding layer 38 composed of GaAlAs:Zn, and a GaAs:Zn contact layer 40. A generally two-sided notch or cut 42 formed by the methods claimed below includes a substantially vertical wall 44 and an inclined mirror 46, which is shown extending down into the laser 24, traversing the active layer 36 and terminating at a notch intersection 48 in the vicinity of the lower cladding layer 34. Actual tests performed by the inventors have produced notches measuring only a few millionths of a meter in depth. When the laser is stimulated by applying a bias voltage, a population inversion is created in the active layer 36 and laser light propagates back and forth between the cleaved end surfaces 26 and 28. Although the method of the ion milling invention allows for the fabrication of the inclined mirror 46 at virtually any angle with respect to the longitudinal axis of the workpiece, the 45 degree configuration shown for illustrative purposes in FIG. 2 is one of the most useful embodiments of the present invention. The advantage of the 45 degree mirror is that the output of the laser is directed up and out of the notch 42 instead of the more usual emission in the plane of the active region 36. The ion-milled mirror 46 provides an inexpensive, reliable, and effective means of producing huge arrays of surface emitting lasers that each contribute powerful beams of laser radiation 50 propagating in a direction orthogonal to the plane of the array.

Figure 13A:
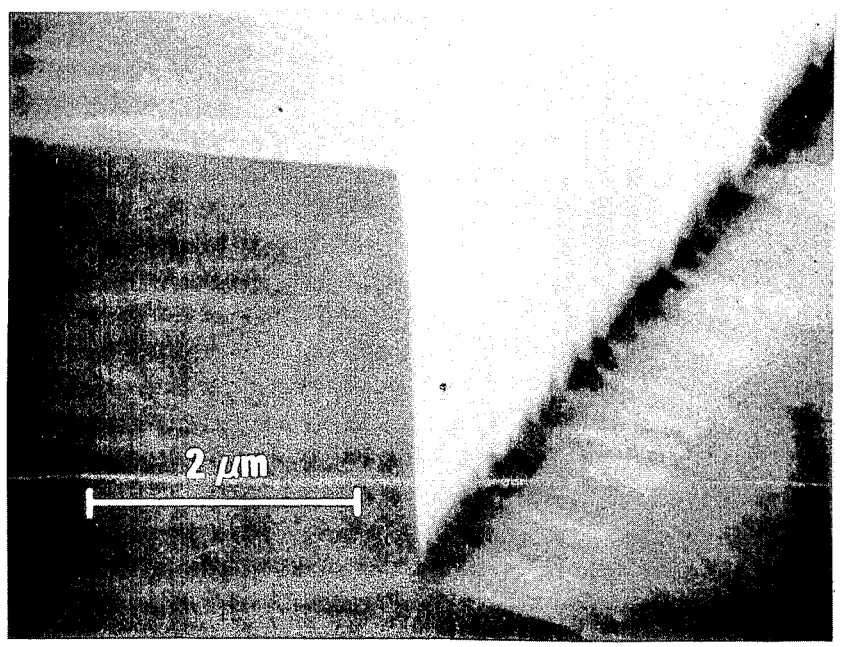
FIGS. 13a and 13b are reproductions of photographs of actual results of the ion milling process.
Figure 13B:
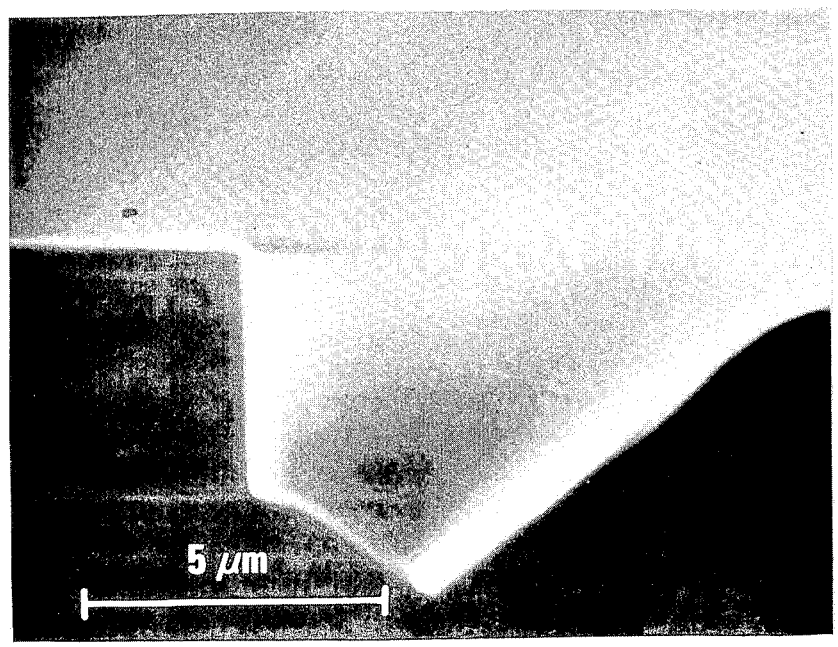

Although the ideal shape of notch 42 is two-sided, various physical phenomena sometime contribute to create a third segment referred to as a shelf region 52 between vertical wall 44 and the inclined rror 46. In addition to depicting the elaborate surface stripe geometry 53 of another of the embodiments of the present invention, FIG. 3 provides a perspective view of a generally three-sided notch 54 comprising a vertical wall 44 and an inclined mirror 46 connected by a curved shelf region 52. FIG. 4 includes a cross-sectional view of an ion milled semiconductor laser with a three sided notch 54. FIGS. 13a and 13b are reproductions of photographs of actual results of the ion milling process.

Figure 6:
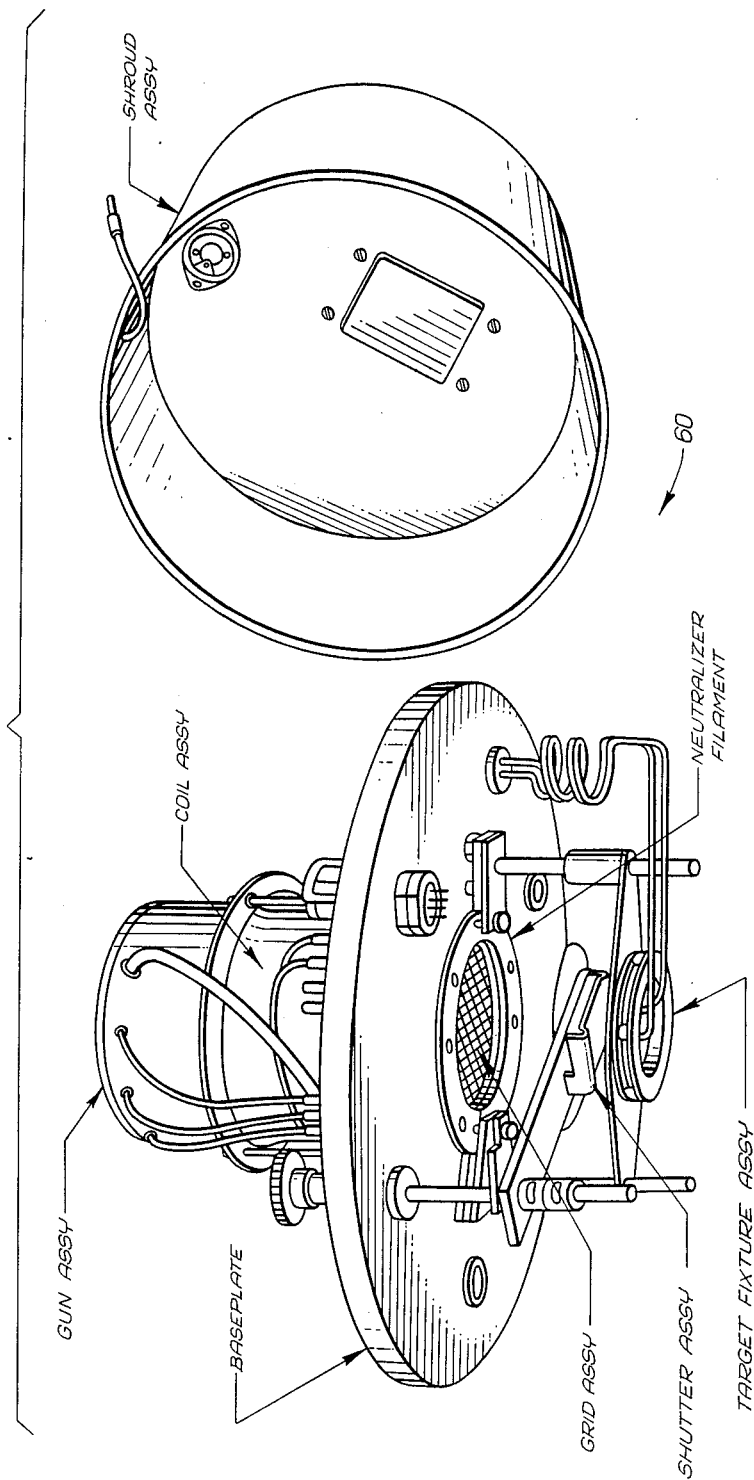
FIG. 6 is a perspective representation of the ion gun apparatus that is employed in the ion milling method.
Figure 7:
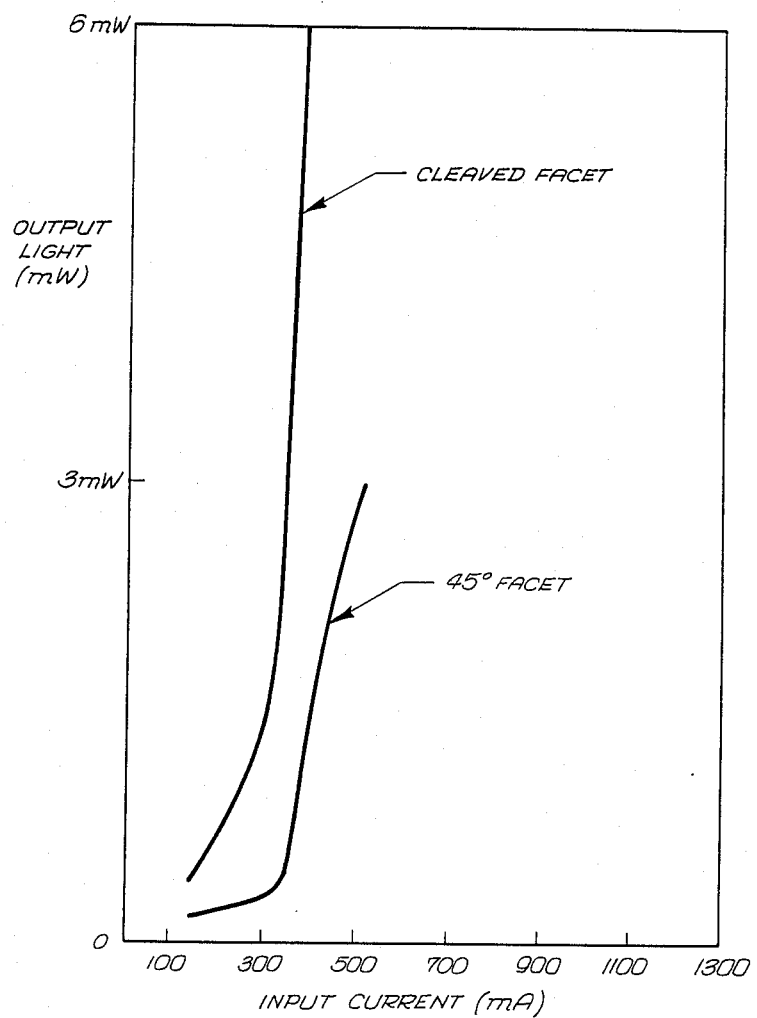
Figure 8:
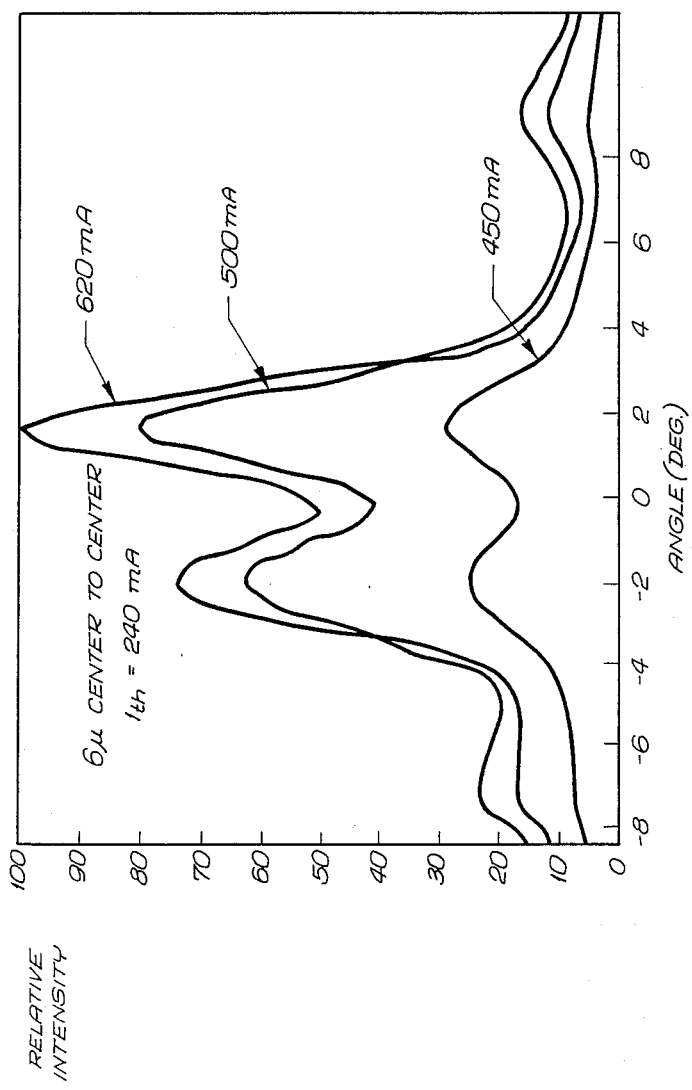
Figure 9:
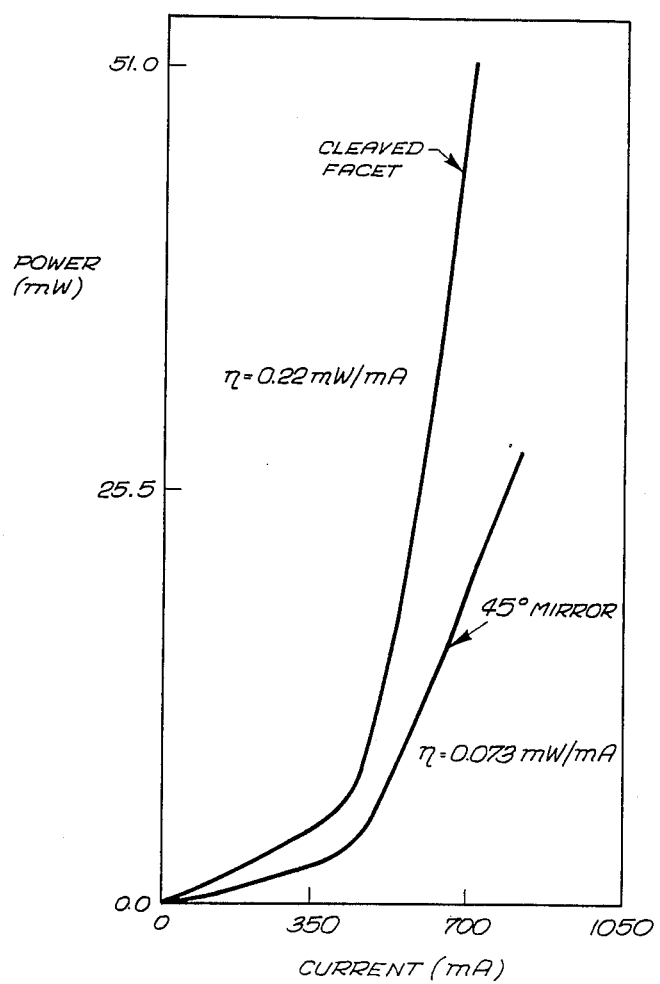

FIGS. 5 and 6 present schematic 60 and perspective illustrations of the ion gun apparatus 60 that is employed in the ion milling method. The device used by the inventors to perform actual tests reported in FIGS. 7 through 12 was a Microetch System manufactured and sold by Veeco. This device is readily commercially available laboratory equipment that is well known to those skilled in the art.

FIG. 12 is an empirical plot collected during actual tests of semiconductor lasers fabricated using the ion milling method. The solid curve 64 and the dashed curve 66 show that in order to fabricate a surface feature such as a 90 degree surface at the same time as an inclined mirror at an angle of 45 degrees (y-axis), the beam angle between the ion gun and the wafer must be approximately 60 degrees (y-axis), or 30 degrees (x-axis). If a single surface away from the beam (curve 64) is desired the slope of curve 64 is 1.5 and it therefore follows that the beam angle (y-axis) must generally be $\frac{2}{3}$ the value of the surface feature that is to be ion milled on a workpiece.

Although the present invention has been described in detail with reference to a particular preferred embodiment, persons possessing ordinary skill in the art to which this invention pertains will appreciate that various modifications and enhancements may be made without departing from the spirit and scope of the claims that follow.

What is claimed is:

1. A method of forming a desired surface having a desired slope angle relative to a longitudinal axis of a workpiece on which said desired surface is to be formed, including the steps of:

placing said workpiece in a substantially evacuated chamber;

masking any region of said workpiece that is to remain unaltered with a highly resistant material;

orienting a source of particles at a beam angle having a predetermined magnitude, said beam angle being measured from said longitudinal axis of said workpiece, said beam angle being substantially equal to the product of approximately ⅔ times said desired slope angle of said desired surface to be formed on said workpiece; and directing a beam of particles from said source toward said workpiece until said desired surface is formed.

2. A method of forming a desired surface on a workpiece as recited in claim 1 and further including the step of:

varying said beam angle in accordance with a predetermined time-dependent function.

3. A method of simultaneously forming a substantially vertical wall and an adjacent mirror disposed at an angle of approximately 45 degrees to an active layer in a semiconductor laser diode, including the steps of:

placing said semiconductor laser diode in a substantially evacuated chamber;

masking any region of said semiconductor laser diode that is to remain unaltered with a highly resistant material;

orienting an ion gun at a beam angle of approximately 60 degrees above said active layer of said semiconductor laser diode; and directing said beam of ions from said ion gun toward said semiconductor laser diode until said substantially vertical wall and said adjacent mirror are formed.

4. A method of simultaneously forming a substantially vertical wall and an adjacent mirror disposed at an angle of approximately 45 degrees to an active layer in a semiconductor laser diode as claimed in claim 3, including the additional steps of:

introducing an inert gas into said chamber after evacuation; then maintaining a gas pressure level within said chamber of approximately $8 \times 10^{-5}$ torr; and maintaining a temperature within said chamber of approximately 20 degrees Centigrade.

5. A method of simultaneously forming a substantially vertical wall and an adjacent mirror disposed at an angle of approximately 45 degrees to an active layer in a semiconductor laser diode as claimed in claim 3, including the additional steps of:

reducing the intensity of said beam of ions from said ion gun after said substantially vertical wall and said adjacent mirror are formed; and continuing to direct said beam of ions from said ion gun toward said semiconductor laser diode at a reduced intensity until said substantially vertical wall and said adjacent mirror are milled to a smooth finish.

* * * * *